(12) United States Patent
Zhang et al.

(10) Patent No.: US 12,272,683 B2
(45) Date of Patent: Apr. 8, 2025

(54) DISPLAY PANEL AND DISPLAY APPARATUS

(71) Applicants: BOE MLED Technology Co., Ltd., Beijing (CN); BOE Technology Group Co., Ltd., Beijing (CN)

(72) Inventors: Gongtao Zhang, Beijing (CN); Haiwei Sun, Beijing (CN); Jian Sang, Beijing (CN); Fang Wang, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/530,257

(22) Filed: Dec. 6, 2023

(65) Prior Publication Data
US 2024/0105691 A1 Mar. 28, 2024

Related U.S. Application Data

(63) Continuation of application No. 17/252,284, filed as application No. PCT/CN2020/080040 on Mar. 18, 2020, now Pat. No. 11,862,617.

(51) Int. Cl.
*H01L 25/13* (2006.01)
*H01L 33/60* (2010.01)

(52) U.S. Cl.
CPC .............. *H01L 25/13* (2013.01); *H01L 33/60* (2013.01)

(58) Field of Classification Search
CPC .......................... G02F 1/13336; G06F 3/1446
See application file for complete search history.

(56) References Cited

U.S. PATENT DOCUMENTS 6,476,886 B2 * 11/2002 Krusius ............... G02F 1/13336
349/122
6,624,870 B1 * 9/2003 Greene ............... G02F 1/13336
349/73
(Continued)

FOREIGN PATENT DOCUMENTS

CN 103296017 A 9/2013
CN 104132621 A 11/2014
(Continued)

OTHER PUBLICATIONS

International Search Report for PCT/CN2020/080040 Mailed Dec. 10, 2020.
(Continued)

*Primary Examiner* — Luis Perez-Fuentes
(74) *Attorney, Agent, or Firm* — Ling Wu; Stephen Yang; Ling and Yang Intellectual Property

(57) ABSTRACT

A display panel includes a plurality of sub-panels tiled in sequence along a first direction. The sub-panels have a first edge and a second edge in the first direction. The sub-panels include a column of first pixels closest to the first edge, a column of second pixels closest to the second edge, and a plurality of columns of third pixels between the column of first pixels and the column of second pixels. A sum of a distance between effective display bodies in the first pixels and the first edge and a distance between effective display bodies in the second pixels and the second edge is smaller than a spacing between effective display bodies in two adjacent columns of the third pixels.

20 Claims, 6 Drawing Sheets

(56) References Cited

U.S. PATENT DOCUMENTS

| | | | | |
|---|---|---|---|---|
| 9,529,563 | B2* | 12/2016 | Kazmierski | G06F 3/1446 |
| 10,546,516 | B2* | 1/2020 | Tomoda | G09G 3/3208 |
| 11,281,039 | B2* | 3/2022 | Zhou | G06V 40/1324 |
| 11,840,758 | B2* | 12/2023 | Cope | G09F 9/30 |
| 11,862,617 | B2* | 1/2024 | Zhang | G09G 3/32 |
| 11,991,841 | B2* | 5/2024 | Li | H05K 5/0021 |
| 2015/0293394 | A1 | 10/2015 | Chung et al. | |
| 2016/0093244 | A1 | 3/2016 | Kazmierski et al. | |
| 2016/0197134 | A1 | 7/2016 | Jung et al. | |
| 2017/0140679 | A1 | 5/2017 | Tomoda et al. | |

FOREIGN PATENT DOCUMENTS

| | | |
|---|---|---|
| CN | 104505021 A | 4/2015 |
| CN | 106133812 A | 11/2016 |
| CN | 106537235 A | 3/2017 |
| CN | 107505759 A | 12/2017 |
| CN | 109448561 A | 3/2019 |
| CN | 110599946 A | 12/2019 |
| JP | H0843838 A | 2/1996 |
| JP | H08184850 A | 7/1996 |
| JP | 2014066745 A | 4/2014 |

OTHER PUBLICATIONS

The Second Office Action dated Sep. 12, 2023 for Chinese Patent Application No. 202080000306.0 and English Translation.
The First Office Action dated Apr. 8, 2023 for Chinese Patent Application No. 202080000306.0 and English Translation.
Notice of Allowance dated Aug. 23, 2023 for U.S. Appl. No. 17/252,284.

* cited by examiner

DISPLAY PANEL AND DISPLAY APPARATUS

CROSS-REFERENCE TO RELATED APPLICATION(S)

This application is a continuation of U.S. application Ser. No. 17/252,284 filed Dec. 15, 2020, which is U.S. National Phase Entry of International Application No. PCT/CN2020/080040 having an international filing date of Mar. 18, 2020, which are hereby incorporated into this application by reference in their entireties.

TECHNICAL FIELD

The present disclosure relates to, but is not limited to, the field of display technology, in particular to a display panel and a display apparatus.

BACKGROUND

At present, tiled display is becoming increasingly popular, and particularly relates to large-size seamless tiled display products packaged with small chips (such as micro LEDs or mini LEDs). In most tiled display products in the market, there are differences between the pixel pitch at a seam and the pixel pitches at the position other than the seams, resulting in a dislocation of the pixels at the seam or an excessive pixel pitch at the seam, which affects the display effect.

SUMMARY

The following is a summary of subject matter described in detail herein. This summary is not intended to limit the protection scope of the claims.

In one aspect, the present disclosure provides a display panel. The display panel includes a plurality of sub-panels tiled in sequence along a first direction. The sub-panels have a first edge and a second edge in the first direction. The sub-panels include a plurality of columns of pixels. The plurality of columns of pixels include a column of first pixels closest to the first edge, a column of second pixels closest to the second edge, and a plurality of columns of third pixels between the column of first pixels and the column of second pixels. An effective display body is provided in each of the first pixels, the second pixels and the third pixels. A sum of a distance between effective display bodies in the first pixels and the first edge and a distance between effective display bodies in the second pixels and the second edge is smaller than a spacing between effective display bodies in two adjacent columns of the third pixels.

In some possible implementations, the distance between the effective display bodies in the first pixels and the first edge is p8. The distance between the effective display bodies in the second pixels and the second edge is p9. The third pixels have a first boundary towards the first edge and a second boundary towards the second edge. A distance between effective display bodies in the third pixels and the first boundary and a distance between effective display bodies in the third pixels and the second boundary are p1 and p4, respectively. A width of a seam between two adjacent sub-panels in the first direction is w1. The difference between a sum of p1 and p4 and a sum of p8 and p9 is substantially equal to w1.

In some possible implementations, the third pixels have a first boundary towards a first edge and a second boundary towards a second edge. A distance between effective display bodies in the third pixels and the first boundary and a distance between effective display bodies in the third pixels and the second boundary are p1 and p4 respectively. A distance between effective display bodies in the first pixels and a boundary of the first pixels towards the second edge is p24, a distance between effective display bodies in the second pixels and a boundary of the second pixels towards the first edge is p21, where p21=p1, and p24=p4.

In some possible implementations, a distance between effective display bodies in the first pixels and the first edge is p8, and a distance between effective display bodies in the second pixels and the second edge is p9, where p9<p4, and p8=p1.

In some possible implementations, a distance between effective display bodies in the first pixels and the first edge is p8, and a distance between effective display bodies in the second pixels and the second edge is p9, where p9=p4, and p8<p1.

In some possible implementations, a distance between effective display bodies in the first pixels and the first edge is p8, and a distance between effective display bodies in the second pixels and the second edge is p9, where p9<p4, and p8<p1.

The third pixels have a first boundary towards the first edge and a second boundary towards the second edge. A distance between effective display bodies in the third pixels and the first boundary and a distance between effective display bodies in the third pixels and the second boundary are p1 and p4 respectively. A distance between effective display bodies in the first pixels and a boundary of the first pixels towards the second edge is p24, a distance between effective display bodies in the second pixels and a boundary of the second pixels towards the first edge is p21. A distance between effective display bodies in the first pixels and the first edge is p8, a distance between effective display bodies in the second pixels and the second edge is p9, where p9<p4, p21<p1, p8=p1, and p24=p4.

In some possible implementations, a width of the third pixels in the first direction is p, where p1-p21≤p*δ, and 3%≤δ≤5%.

In some possible implementations, the sub-panels further include k columns of fourth pixels between the column of second pixels and the columns of third pixels. Effective display bodies are arranged in the fourth pixels. A distance between effective display bodies in the fourth pixels and a boundary of the fourth pixels towards the first edge is p22, a distance between the effective display bodies in the fourth pixels and a boundary of the fourth pixels towards the second edge is p23, where p21<p22, and p22<p1.

In some possible implementations, a width of the third pixels in the first direction is p, where p1-p22≤p*δ, (p1+p4)-(p21+p23)≤p*δ, and 3%≤δ≤5%.

In some possible implementations, the display panel further includes a plurality of sub-panels tiled in sequence along a second direction. The sub-panels have a third edge and a fourth edge in the second direction. The sub-panels include a plurality of rows of pixels. The plurality of rows of pixels include a row of fifth pixels closest to the third edge, a row of sixth pixels closest to the fourth edge, and a plurality of rows of the third pixels between the row of fifth pixels and the row of sixth pixels. An effective display body is provided in each of the fifth pixels and the sixth pixels. A sum of a distance between effective display bodies in the fifth pixels and the third edge and a distance between effective display bodies in the sixth pixels and the fourth edge is smaller than a spacing between effective display bodies in two adjacent rows of the third pixels.

In some possible implementations, a distance between effective display bodies in the fifth pixels and the third edge is p31. A distance between effective display bodies in the sixth pixels and the fourth edge is p34. The third pixels have a fourth boundary towards the third edge and a third boundary towards the fourth edge. A distance between effective display bodies in the third pixels and the fourth boundary and a distance between effective display bodies in the third pixels and the third boundary are p3 and p2, respectively. A width of a seam between two adjacent sub-panels in the second direction is w2. The difference between a sum of p3 and p2 and a sum of p31 and p34 is substantially equal to w2.

In some possible implementations, the third pixels have a fourth boundary towards a third edge and a third boundary towards a fourth edge. A distance between effective display bodies in the third pixels and the third boundary and a distance between effective display bodies in the third pixels and the fourth boundary are p3 and p2 respectively. A distance between effective display bodies in the fifth pixels and a boundary of the fifth pixels towards the fourth edge is p32, a distance between effective display bodies in the sixth pixels and a boundary of the sixth pixels towards the third edge is p33, where p32=p2, and p33=p3.

In some possible implementations, the effective display body includes a plurality of LED chips and a bank structure around each of the LED chips. The bank structure is configured to make light emitted from the LED chip converge.

In some possible implementations, the display panel further includes a carrier base substrate. The plurality of sub-panels are tiled in sequence on the carrier base substrate. The display panel further includes a fixing glue between the carrier base substrate and the sub-panels.

In another aspect, the present disclosure also provides a display apparatus, including the display panel described above.

Other features and advantages of technical solutions of the present disclosure will be set forth in the description which follows, and in part will become apparent from the description, or be learned by practice of the technical solutions of the present disclosure. Purposes and other advantages of the technical solutions of the present disclosure may be realized and obtained by structures specifically indicated in the specification, claims and accompanying drawings.

Other aspects will become apparent upon reading and understanding accompanying drawings and the detailed description.

BRIEF DESCRIPTION OF THE DRAWINGS

Accompanying drawings are used to provide a further understanding of technical solutions of the present disclosure, form a part of the specification, and explain technical solutions of the present disclosure together with embodiments of the present disclosure, while they do not constitute a limitation on the technical solutions of the present disclosure.

DETAILED DESCRIPTION

To make the objects, technical solutions and advantages of the present disclosure more clear, embodiments of the present disclosure will be described in detail below with reference to the accompanying drawings. Those skilled in the art should understand that embodiments in the present disclosure and features in the embodiments may be combined with each other arbitrarily if there is no conflict.

Figure 1:
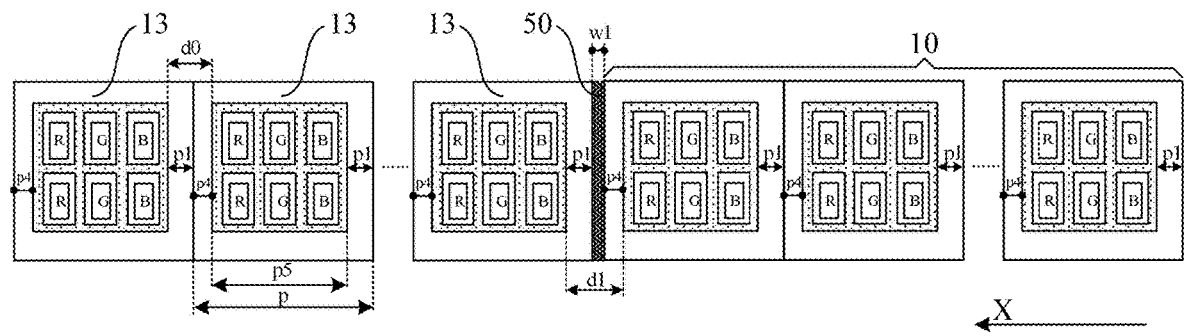
FIG. 1 is a schematic structural diagram of a display panel.

FIG. 1 is a schematic structural diagram of a display panel. As shown in FIG. 1, the display panel includes a plurality of sub-panels 10 tiled in sequence along a first direction X (in FIG. 1, the first direction is from right to left). For convenience of illustration and description, only one row of pixels is shown in FIG. 1. Due to the existence of assembly accuracy, there is a seam 50 between two adjacent sub-panels 10. The width of the seam 50 is w1. The sub-panel 10 includes a plurality of columns of third pixels 13 along the first direction X. The width of a third pixel 13 in the first direction X is a third width p. An effective display body 135 is provided in the third pixel 13. The width of the effective display body 135 in the first direction X is p5. At a position other than the seam 50, the spacing d0 between two adjacent columns of effective display bodies 135 is equal to p1+p4. However, at the seam 50, the spacing d1 between the effective display bodies 135 on both sides of the seam 50 is equal to p1+p4+w1.

As shown in FIG. 1, due to the existence of the seam 50, the spacing between the effective display bodies 135 on both sides of the seam 50 increases to d1. The width w1 of the seam 50 is larger due to the assembly tolerance and the dimensional tolerance of the display panel. In this way, the spacing d1 between the effective display bodies 135 on both sides of the seam 50 is much larger than the spacing d0 between the effective display bodies 135 at the position other than the seam. As a result, when the display panel displays, the seam 50 is visualized as a very wide black strip, as shown in FIG. 1, which affects the display effect of the display panel and reduces the uniformity of the display effect.

Figure 2:
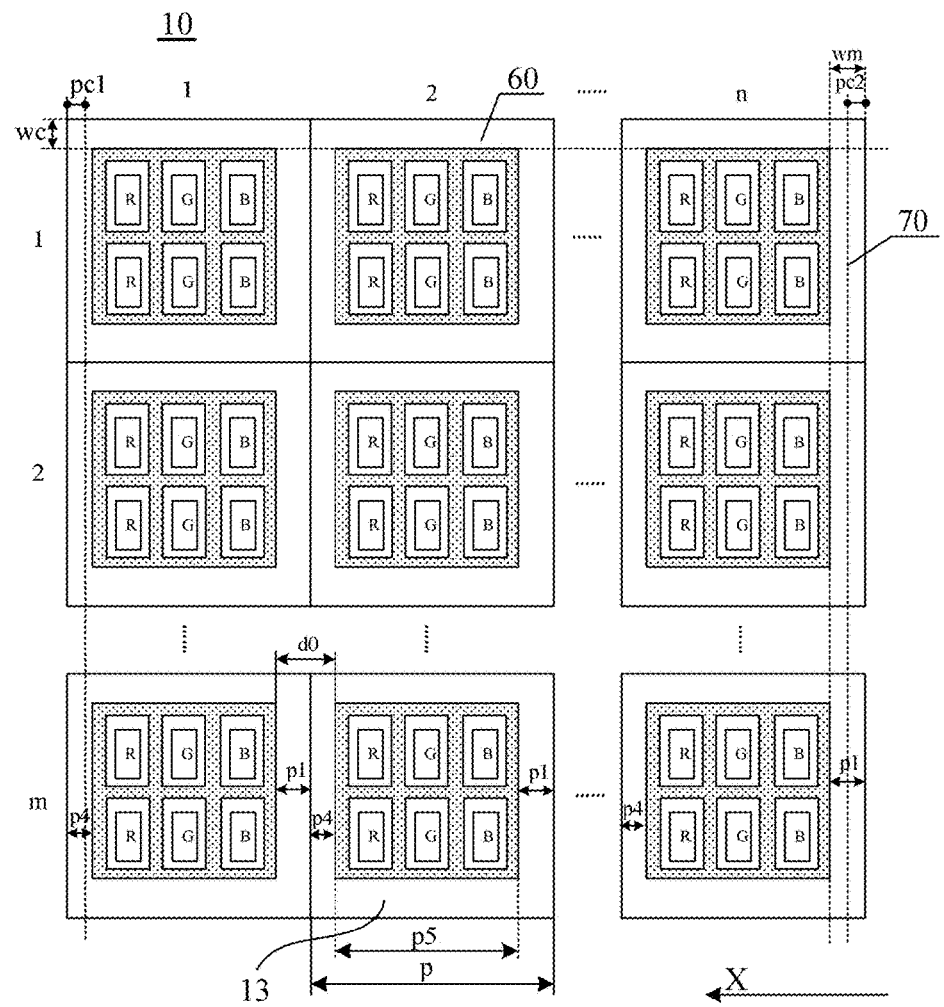
FIG. 2 is a schematic structural diagram of the sub-panels in FIG. 1.
Figure 3:
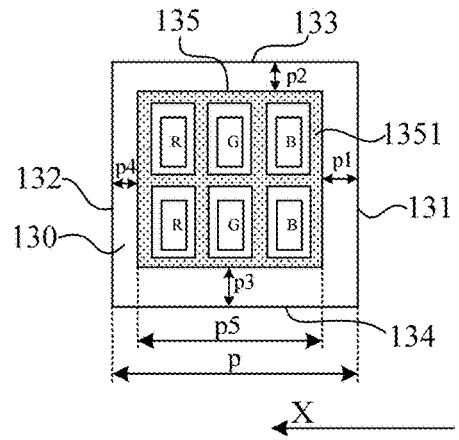
FIG. 3 is a schematic structural diagram of a third pixel in FIG. 2.

FIG. 2 is a schematic structural diagram of the sub-panels in FIG. 1. FIG. 3 is a schematic structural diagram of a third pixel in FIG. 2. As shown in FIG. 2, the sub-panels include a plurality of third pixels 13. The plurality of third pixels 13 are arranged in an array of m rows and n columns. As shown in FIG. 3, a third pixel 13 includes a first boundary 131, a third boundary 133, a second boundary 132, and a fourth boundary 134 connected in sequence. The third pixel 13 also includes an effective display body 135 within the boundaries. The effective display body 135 may include a plurality of LED chips, such as mini LEDs or micro LEDs. In an exemplary embodiment, the effective display body 135 may include three LED chips, such as a R, a G and a B. In an exemplary embodiment, the effective display body 135 may include six LED chips, such as two R, two G and two B, as shown in FIG. 3, in which three LEDs are redundant. In an exemplary embodiment, the effective display body 135 may include four LED chips, such as one R, one G and one B, and one R or G or B, in which one LED is redundant. The effective display body 135 may further include a bank structure 1351. The bank structure 1351 is arranged around each LED. The material of the bank structure 1351 may be a white material with high reflectivity, such as white glue or epoxy resin and the like. As a result, the bank structure 1351 may make the light emitted from each LED converge toward its center, avoid LED light from scattering into the ambiance, and improve light-emitting efficiency and uniformity of display.

As shown in FIG. 3, in the third pixel 13, the width of the effective display body 135 in the first direction is p5. The distance between the effective display body 135 and the first boundary 131 is p1. The distance between the effective display body 135 and the second boundary 132 is p4. The distance between the effective display body 135 and the third boundary 133 is p2. The distance between the effective display body and the fourth boundary 134 is p3. The values of p1, p4, p2 and p3 may be determined as required. In an exemplary embodiment, p1=p4, and p2=p3. A black light-shielding material 130 is provided between the effective display body 135 and the boundaries of the third pixel 13. In FIG. 3, in order to clearly illustrate the distance between the effective display body and the boundaries of the pixel, the black light-shielding material 130 is illustrated as white. Those skilled in the art may understand that when the black light-shielding material 130 is provided between the effective display body and the boundaries of the pixel, the area between the effective display body and the boundaries of the pixel is actually black. The width of the third pixel 13 in the first direction is the third width p. In FIG. 3, the third width p is equal to p1+p4+p5. As shown in FIG. 2, a channel region 60 is arranged on the upper side of the sub-panels. A MUX region 70 is arranged in the right side of the sub-panels. The width of the channel region 60 may be wc. The width of the MUX region 70 may be wm. The wm may be equal to p1. In FIG. 2, in the first direction X, the pitch between two adjacent third pixels 13 is p. That is, the third pixels 13 have an arrangement period of p in the first direction X. As shown in FIG. 2, in the sub-panel 10, the spacing d0 between two adjacent columns of effective display bodies 135 is equal to p1+p4.

Figure 4:
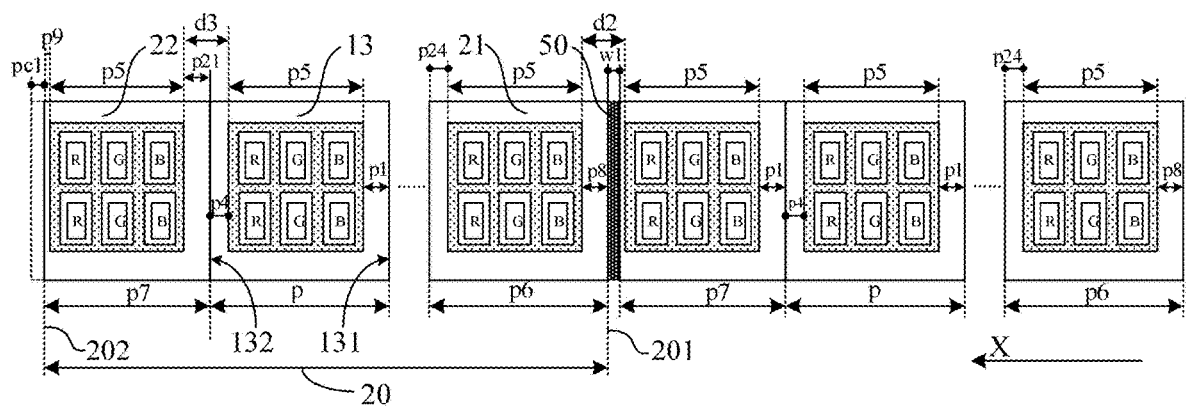
FIG. 4 is a schematic structural diagram of a display panel according to an exemplary embodiment.

FIG. 4 is a schematic structural diagram of a display panel according to an exemplary embodiment. For convenience of description, only one row of pixels is shown in FIG. 4. As shown in FIG. 4, in an exemplary embodiment, the display panel includes a plurality of sub-panels 20 tiled in sequence along a first direction X. A sub-panel 20 has a first edge 201 and a second edge 202 in the first direction X. In the first direction X, the sub-panel 20 includes a plurality of columns of pixels. The plurality of columns of pixels include a column of first pixels 21 closest to the first edge 201, a column of second pixels 22 closest to the second edge 202, and a plurality of columns of third pixels 13 between the column of first pixels 21 and the column of second pixels 22. An effective display body 135 is provided in each of the first pixels 21, the second pixels 22 and the third pixels 13. A sum of the distance between an effective display body in the first pixel and the first edge and the distance between an effective display body in the second pixel and the second edge is smaller than the spacing between effective display bodies in two adjacent columns of third pixels.

In the display panel according to an embodiment of the present disclosure, as shown in FIG. 4, the distance between an effective display body in the first pixel 21 and the first edge 210 is p8. The distance between an effective display body in the second pixel 22 and the second edge 201 is p9. As shown in FIG. 3, the third pixel 13 has a first boundary 131 towards the first edge 201 and a second boundary 132 towards the second edge 202. The distance between an effective display body in the third pixel 13 and the first boundary 131 is p1. The distance between the effective display body in the third pixel 13 and the second boundary 132 is p4. The sum of the distance between an effective display body in the first pixel and the first edge and the distance between an effective display body in the second pixel and the second edge is smaller than the spacing between effective display bodies in two adjacent columns of third pixels. That is, the sum of p8 and p9 is smaller than the sum of p1 and p4. Therefore, in the display panel according to an embodiment of the present disclosure, at the seam 50 between the two sub-panels 20, the spacing d2 between the effective display bodies on both sides of the seam 50 is equal to p8+p9+w1. Compared with d1 in the display panel of FIG. 1, which is equal to p1+p4+w1, the sum of p8 and p9 is smaller than the sum of p1 and p4, so that d2 is less than d1. That is, in an embodiment of the present disclosure, the spacing between the effective display bodies on both sides of the seam 50 is smaller than the spacing between the effective display bodies on both sides of the seam 50 in FIG. 1, thus reducing the spacing between the effective display bodies at the seam. As a result, the spacing between the effective display bodies at the seam is closer to the spacing between the effective display bodies at the position other than the seam, thereby reducing or even eliminating the black strip effect at the seam, improving the display effect of the display panel at the seam, and improving the uniformity of the display effect of the display panel.

In an exemplary embodiment, in the first direction, the width of the seam between two adjacent sub-panels is w1. The difference between the sum of p1 and p4 and the sum of p8 and p9 is substantially equal to w1. That is, the value of (p1+p4)−(p8+p9) is substantially equal to that of w1. Those skilled in the art may understand that there are process errors when tiling two sub-panels, so the value of (p1+p4)−(p8+p9) is substantially equal to that of w1. That is, the values of (p1+p4)−(p8+p9) and w1 are within the allowable range of process errors, the value of (p1+p4)−(p8+p9) may be deemed to be equal to that of w1. In an exemplary embodiment, [(p1+p4)−(p8+p9)]/w1 is 95% to 105%, or w1/[(p1+p4)−(p8+p9)] is 95% to 105%. In this way, the spacing between the effective display bodies on both sides of the seam 50 is substantially equal to the spacing between the effective display bodies at the position other than the seam 50, thereby improving uniformity of the display effect of the display panel.

As shown in FIG. 4, the distance between an effective display body in the first pixel 21 and the first edge 201 is p8. The distance between an effective display body in the second pixel 22 and the second edge 201 is p9. The third pixel 13 has a first boundary 131 towards the first edge 201 and a second boundary 132 towards the second edge 202. The distance between an effective display body in the third pixel 13 and the first boundary 131 is p1. The distance between an effective display body in the third pixel 13 and the second boundary 132 is p4. The distance between an effective display body in the first pixel 21 and a boundary of the first pixel 21 towards the second edge 202 is p24. The distance between an effective display body in the second pixel 22 and a boundary of the second pixel 22 towards the first edge 201 is p21.

In an exemplary embodiment, p9<p4, p8=p1, p24=p4, and p21=p1. In such a display panel, the spacings between adjacent effective display bodies at the positions not close to the seam 50 are equal, which further improves uniformity of the display effect of the display panel.

In an exemplary embodiment, as shown in FIG. 4, the difference between p4 and p9 (i.e., pc1) may be equal to the width of the seam 50 between adjacent sub-panels. In this way, the spacing between the effective display bodies on both sides of the seam 50 is equal to the spacing between the effective display bodies at the position other than the seam 50, thereby improving uniformity of the display effect of the display panel.

In an exemplary embodiment, p9<p4, p8=p1, p21=p1, and p24=p4. The sub-panel 10 may be further processed to obtain the sub-panel 20. As shown in FIG. 3, in an exemplary embodiment, the sub-panel 10 shown in FIG. 2 may be processed by a grinding or cutting process to obtain a sub-panel 20. For example, the left edge of the sub-panel 10 shown in FIG. 2 is ground or cut by a grinding or cutting process. To prevent the cutting from affecting the effective display body, the cutting distance pc1 is required to be smaller than p4, i.e., pc1<p4. The grinding or cutting accuracy is pt, where pt<p4−pc1, i.e., pt<p9. As a result, the sub-panel 20 is obtained, in which the width p7 of the second pixel 22 in the first direction X is smaller than the width p of the third pixel 13 in the first direction X. That is, p7<p, and p7=p−pc1. In an exemplary embodiment, when the two sub-panels 20 are tiled along the first direction X, the assembly accuracy is pa, and thus, for cutting on one side, the width w1 of the seam is equal to pt+pa. In an exemplary embodiment, pa is about 0.02 mm, and pt is about 0.02 mm Those skilled in the art may understand that the value of pa is determined according to different assembly conditions. For example, 0.005≤pa≤0.05. For example, in FIG. 2, p=1 mm, p5=0.8 mm and p4=0.1 mm, then the cutting distance pc1=w1=0.04 mm. The left edge of the display panel in FIG. 2 is cut by 0.04 mm, and thus the sub-panel 20 in FIG. 4 may be obtained, with p9 of the sub-panel 20 being equal to 0.06 mm.

In an exemplary embodiment, as shown in FIG. 4, p9<p4, p21<p1, p8=p1, and p24=p4. In such a display panel, the value of p21 is reduced, so that the spacing between the effective display body in the second pixel 22 and the effective display body in the third pixel 13 is reduced, but p9>0 is ensured. In this way, when the second pixel 22 is formed by a cutting or grinding process, the left edge of the second pixel 22 may not affect the effective display body in the second pixel 22, and may not affect the display effect of the display panel.

In an exemplary embodiment, for example, the sub-panel 10 may be further modified to obtain the sub-panel 20. In an exemplary embodiment, a sub-panel shown in FIG. 2 may be modified to obtain the sub-panel 20. For example, the distance between a leftmost effective display body in FIG. 2 and the first boundary may be reduced from p1 to p21, and then the left edge of the sub-panel may be ground or cut by a grinding and cutting process. For example, in FIG. 2, p=0.6 mm, p5=0.5 mm, P4=0.05 mm, pa is about 0.02 mm, and pt is about 0.02 mm, and thus the cutting distance pc1 is equal to 0.04 mm. If p21=p1, then p9=0.05−0.04=0.01 mm, which may not meet pt<p9. Therefore, p21 should be adjusted so that p21<p1. In an exemplary embodiment, p1-p21≤p*δ, and 3%≤δ≤5%. For example, δ is equal to 5% or 3%. In an exemplary embodiment, δ=3%, (p1-p21)/p=6, then p9=0.01+0.018=0.028 mm, which meets pt<p9. Therefore, p1 of the leftmost pixel of the sub-panel in FIG. 2 may be adjusted to p21 (that is, p1 is reduced by 0.018), and the left edge of the sub-panel is cut by 0.04 mm.

As a result, as shown in FIG. 4, the spacing between an effective display body in the second pixel 22 and an effective display body in the adjacent third pixel 13 is p21+p4. If p1-p21=L (L≤p*δ), the spacing between the effective display body in the second pixel 22 and the effective display body in the adjacent third pixel 13 is d3, and d3 is equal to p1+p4−L, thus ensuring p9>pt. In this way, when the second pixel 22 is formed by a cutting or grinding process, the left edge of the second pixel 22 may not affect the effective display body in the second pixel 22, and may not affect the display effect of the display panel.

Figure 5:
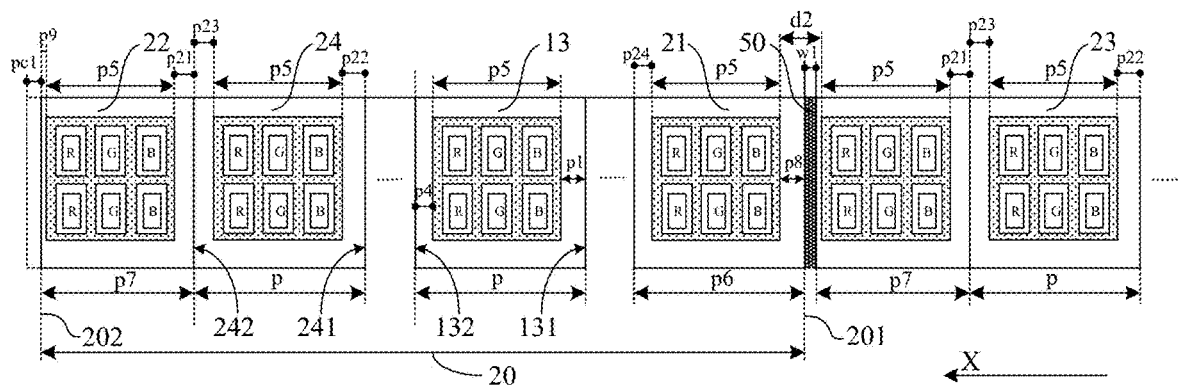
FIG. 5 is a schematic structural diagram of a display panel according to an exemplary embodiment.

FIG. 5 is a schematic structural diagram of a display panel according to an exemplary embodiment. In an exemplary embodiment, as shown in FIG. 5, the sub-panel may further include k columns of fourth pixels 24 between the second pixels 22 and the third pixels 13. The k is a natural number greater than or equal to 1. An effective display body is provided in a fourth pixel 24. A fourth pixel 24 has a first boundary 241 towards the first edge 201 and a second boundary 242 towards the second edge 202. The distance between an effective display body in the fourth pixel 24 and the first boundary 241 of the fourth pixel 24 is p22. The distance between an effective display body in the fourth pixel 24 and the second boundary 242 of the fourth pixel 24 is p23. In an exemplary embodiment, p21<p22, and p22<p1. The width of the fourth pixel 24 in the first direction X is p (i.e., p is equal to the width of the third pixel 13 in the first direction X). p1-p22≤p*δ, (p1+p4)−(p21+p23)≤p*δ, and 3%≤δ≤5%.

In an exemplary embodiment, a sub-panel shown in FIG. 2 may be modified to obtain the sub-panel 20 shown in FIG. 5. For example, p=0.5 mm, p5=0.40 mm, and p1=p4=0.05 mm. The pa is about 0.02 mm and pt is about 0.02 mm, and thus the cutting distance pc1 is equal to pa+pt, where pa+pt=0.04 mm. If p21=p22=p1, then p9=0.01, which may not meet pt<p9. Therefore, if p21 may be adjusted and decreased by 0.02, that is, p21=0.03 mm, then p9=0.03 satisfies pt<p9. If p22=p1, then (p1+p4)−(p21+p23)=0.02, which may not meet (p1+p4)−(p21+p23)≤p*δ, and 3%≤δ≤5%, so p22 needs to be reduced. The p22 may be reduced by 0.01, so that p23=0.06 mm, (p1+p4)−(p21+p23)= 0.01, which may meet (p1+p4)−(p21+p23)≤p*δ, and 3%≤δ≤5%. Therefore, p=0.5 mm, p5=0.40 mm, p1=p4=0.05 mm, p21=0.03 mm, p9=0.03 mm, p22=0.04 mm and p23=0.06 mm. The number of columns of the fourth pixels 24 is one, i.e., k=1.

Figure 6:
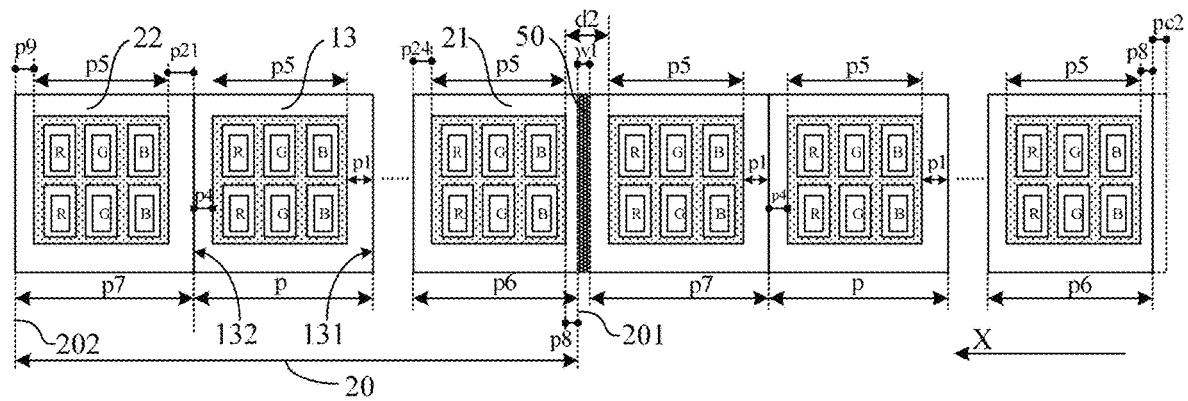
FIG. 6 is a schematic structural diagram of a display panel according to an exemplary embodiment.

FIG. 6 is a schematic structural diagram of a display panel according to an exemplary embodiment. As shown in FIG. 6, the distance between an effective display body in the first pixel 21 and the first edge 201 is p8. The distance between an effective display body in the second pixel 22 and the second edge 201 is p9. In an exemplary embodiment, as shown in FIG. 6, p8<p 1, p9=p4, p24=p4, and p21=p1. The width p7 of the second pixel 22 in the first direction X is equal to p. The width p6 of the first pixel 21 in the first direction X is less than p.

In an exemplary embodiment, as shown in FIG. 6, the difference between p1 and p8 may be equal to the width of the seam 50 between adjacent sub-panels. In this way, the spacing between the effective display bodies on both sides of the seam 50 is equal to the spacing between the effective display bodies at the position other than the seam 50, thereby improving uniformity of the display effect of the display panel.

In an exemplary embodiment, p9=p4, p8<p1, p21=p1, and p24=p4. The sub-panel 10 may be further processed to obtain a sub-panel 20. As shown in FIG. 3, in an exemplary embodiment, the sub-panel 10 shown in FIG. 2 may be processed by a grinding or cutting process to obtain the sub-panel 20. For example, the right edge of the sub-panel 10 shown in FIG. 2 is ground or cut by a grinding or cutting process. To prevent the cutting from affecting the effective display body, the cutting distance pc2 is required to be smaller than p1, i.e., pc2<p1. The grinding or cutting accuracy is pt, where pt<p1-pc2, i.e., pt<p8. As a result, the sub-panel 20 is obtained, in which the width p6 of the first pixel 21 in the first direction X is smaller than the width p of the third pixel 13 in the first direction X. That is, p6<p. In an exemplary embodiment, when the two sub-panels 20 are tiled along the first direction X, the assembly accuracy is pa, and thus, for cutting on one side, the width w1 of the seam is equal to pt+pa. In an exemplary embodiment, pa is about 0.02 mm, and pt is about 0.02 mm. Those skilled in the art may understand that the value of pa is determined according to different assembly conditions. For example, 0.005≤pa≤0.05. For example, in FIG. 2, p=1 mm, p5=0.8 mm and p1=0.1 mm, then the cutting distance pc2 is equal to w1, where w1=0.04 mm. The right edge of the display panel in FIG. 2 is cut by 0.04 mm, and thus the sub-panel 20 in FIG. 4 may be obtained, with p8 of the sub-panel 20 being equal to 0.06 mm.

Figure 7:
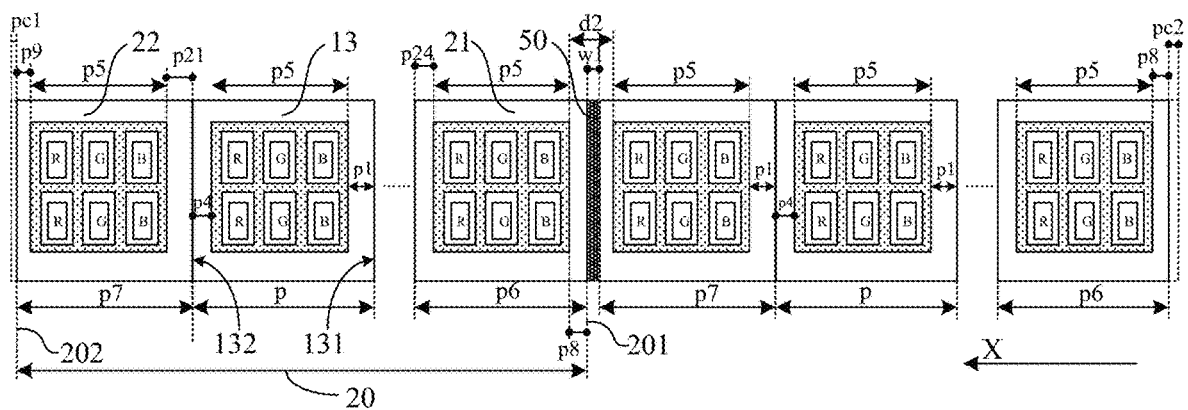
FIG. 7 is a schematic structural diagram of a display panel according to an exemplary embodiment.

FIG. 7 is a schematic structural diagram of a display panel according to an exemplary embodiment. As shown in FIG. 7, the distance between an effective display body in the first pixel 21 and the first edge 201 is p8. The distance between an effective display body in the second pixel 22 and the second edge 201 is p9. In an exemplary embodiment, as shown in FIG. 7, p8<p1, p9<p4, p24=p4, and p21=p1. The width p7 of the second pixel 22 in the first direction X is less than p. The width p6 of the first pixel 21 in the first direction X is less than p.

In an exemplary embodiment, as shown in FIG. 7, the difference between the sum of p1 and p4 and the sum of p8 and p9 may be equal to the width of the seam 50 between adjacent sub-panels, i.e., (p1+p4)−(p8+p9)=w1. In this way, the spacing between the effective display bodies on both sides of the seam 50 is equal to the spacing between the effective display bodies at the position other than the seam 50, thereby improving uniformity of the display effect of the display panel. The sub-panel 20 shown in FIG. 7 may be obtained by processing the sub-panel 10 shown in FIG. 2. For example, the left side and the right side of the sub-panel 10 in FIG. 2 may be ground or cut respectively to obtain the sub-panel 20 shown in FIG. 7.

The accuracy of the grinding or cutting process is pt, and assembly accuracy is pa. When cutting on both sides, the width w1 of the seam is equal to pa+pt. In an exemplary embodiment, pa is about 0.02 mm and pt is about 0.02 mm, so that the width w1 of the seam is equal to 0.04 mm. In FIG. 2, p=1 mm, p5=0.8 mm, p1=0.1 mm and p4=0.1 mm. The sub-panel 10 shown in FIG. 2 may be processed by a grinding or cutting process to obtain a sub-panel 20. The sub-panel 10 is cut on both sides, with a cutting distance of w1/2 on each side. That is, a cutting distance on one side is 0.02 mm. In another word, the sub-panel 20 shown in FIG. 7 may be obtained by respectively cutting the left edge and right edge of the sub-panel 10 in FIG. 2 by 0.02 mm.

Figure 8:
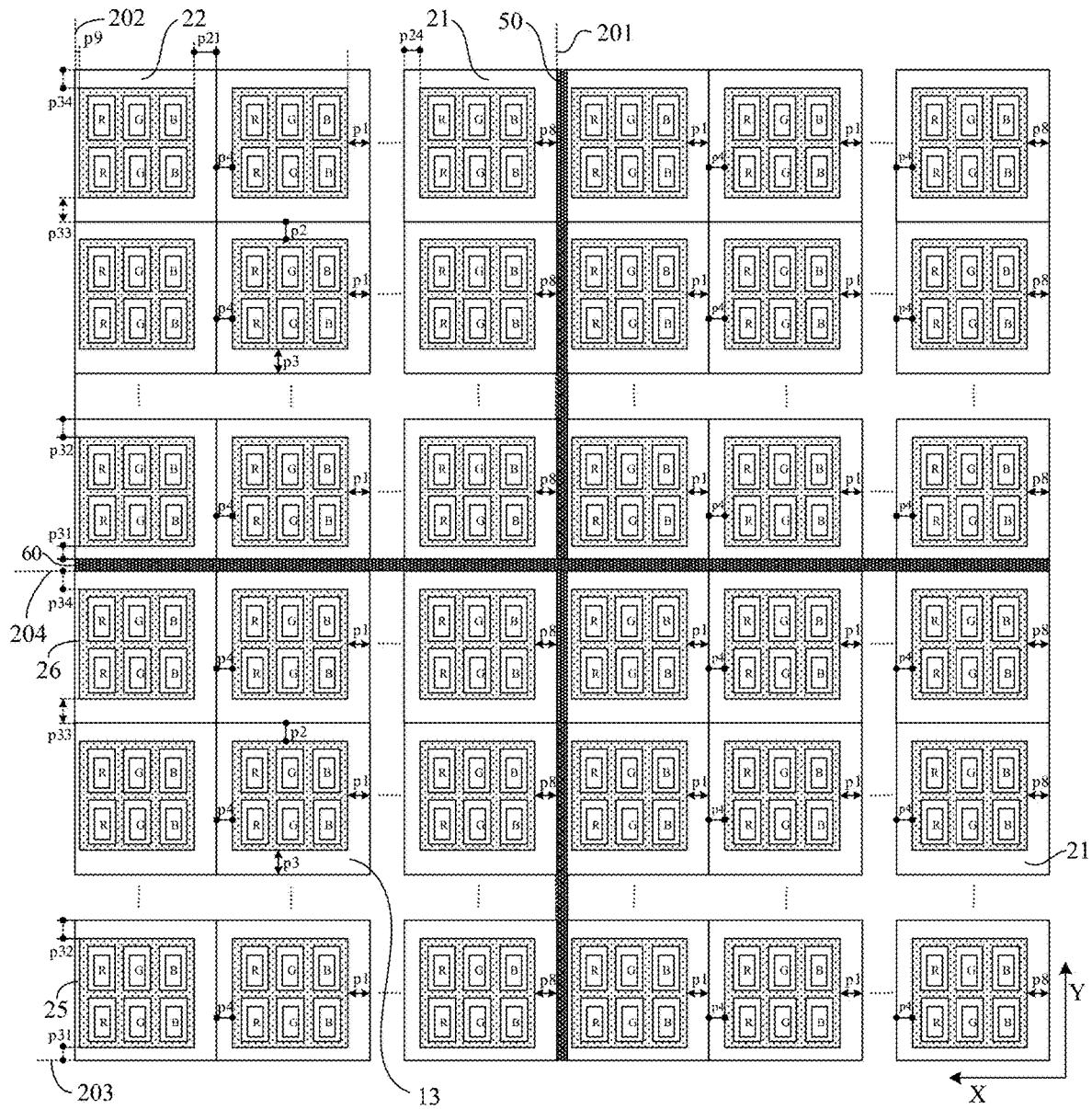
FIG. 8 is a schematic structural diagram of a display panel according to an exemplary embodiment.

FIG. 8 is a schematic structural diagram of a display panel according to an exemplary embodiment. In an exemplary embodiment, as shown in FIG. 8, the display panel may further include a plurality of sub-panels 20 tiled in sequence along a second direction Y (a direction perpendicular to the first direction X). A sub-panel 20 has a third edge 203 and a fourth edge 204 in the second direction Y. In the second direction Y, the sub-panel 20 includes a plurality of rows of pixels. The plurality of rows of pixels include a row of fifth pixels 25 closest to the third edge 203, a row of sixth pixels 26 closest to the fourth edge 204, and third pixels 13 between the row of fifth pixels 25 and the row of sixth pixels 26. An effective display body 135 is provided in each of the fifth pixels 25 and the sixth pixels 26. A sum of the distance between effective display bodies in the fifth pixels and the third edge and the distance between effective display bodies in the sixth pixels and the fourth edge is smaller than the spacing between the effective display bodies in two adjacent rows of third pixels.

Those skilled in the art may understand that for convenience of illustration, only the tiling of two rows and two columns of sub-panels 20 is shown in FIG. 8. The display panel has a seam 50 between two adjacent columns of sub-panels in the first direction X, and a seam 60 between two adjacent rows of sub-panels in the second direction Y.

As shown in FIG. 8, the distance between an effective display body in a fifth pixel 25 and the third edge 203 is p31. The distance between an effective display body in a sixth pixel 26 and the fourth edge 204 is p34. As shown in FIG. 3, in the third pixel 13, the distance between the effective display body 135 and the third boundary 133 is p2. The distance between the effective display body 135 and the fourth boundary 134 is p3. A sum of the distance between an effective display body in the fifth pixel and the third edge and the distance between an effective display body in the sixth pixel and the fourth edge is smaller than the spacing between the effective display bodies in two adjacent rows of third pixels. That is, the sum of p31 and p34 is smaller than the sum of p3 and p2, i.e., p31+p34<p3+p2. In this way, the spacing between the effective display bodies on both sides of the seam 60 may be reduced, so that the spacing between the effective display bodies in the second direction Y at the seam 60 is closer to the spacing between the effective display bodies in the second direction Y at the position other than the seam 60, which improves the display effect of the display panel at the seam 60 and the uniformity of the display effect of the display panel.

In an exemplary embodiment, as shown in FIG. 8, the width of the seam between two adjacent sub-panels in the second direction Y is w2. The difference between the sum of p3 and p2 and the sum of p31 and p34 is substantially equal to w2. That is, the value of (p3+p2)−(p31+p34) are substantially equal to that of w2. Those skilled in the art may understand that there are process errors when tiling two sub-panels, and thus the value of (p3+p2)−(p31+p34) is generally equal to that of w2. That is, the values of (p3+p2)−(p31+p34) and w2 are within the allowable range of process errors, the value of (p3+p2)−(p31+p34) may be deemed to be equal to that of w2. In an exemplary embodiment, [(p3+p2)−(p31+p34)]/w2 is 95% to 105%, or w2/[(p3+p2)−(p31+p34)] is 95% to 105%. The width of the seam is the size of the seam in the direction perpendicular to the extending direction of the seam.

As shown in FIG. 8, the distance between an effective display body in the fifth pixel 25 and a boundary of the fifth pixel 25 towards the fourth edge 204 is p32. The distance between an effective display body in the sixth pixel 26 and a boundary of the sixth pixel 26 towards the third edge 203 is p33.

In an exemplary embodiment, p31<p3, p34=p2, p32=p2, and p33=p3.

In an exemplary embodiment, p31=p3, p34<p2, p32=p2, and p33=p3.

In an exemplary embodiment, p31<p3, p34<p2, p32=p2, and p33=p3.

Those skilled in the art may understand that in the sub-panel 20, as shown in FIG. 8, the distance between the right effective display body and the first edge 201 (left edge) is p8. The distance between the left effective display body and the second edge 202 (left edge) is p9. The distance between the lower effective display body and the third edge 203 (lower edge) is p31. The distance between the upper effective display body and the fourth edge 204 (upper edge) is p34. Therefore, the row of fifth pixel 25 close to the third edge 203 as described herein indicates that the size of each pixel in this row in the second direction Y is consistent, thus collectively referring to the fifth pixels, which cannot be understood as limiting the size of each pixel in this row in the first direction X. The row of sixth pixels 26 close to the fourth edge 204 as described herein indicates that the size of each pixel in this row in the second direction Y is consistent, thus collectively referring to the sixth pixels, which cannot be understood as limiting the size of each pixel in this row in the first direction X. The column of first pixels 21 close to the first edge 201 as described herein indicates that the size of each pixel in this column in the first direction X is consistent, thus collectively referring to the first pixels, which cannot be understood as limiting the size of each pixel in this column in the second direction Y. The column of second pixels 22 close to the second edge 202 as described herein indicates that the size of each pixel in this column in the first direction X is consistent, thus collectively referring to the second pixels, which cannot be understood as limiting the size of each pixel in this column in the second direction Y.

Figure 9:
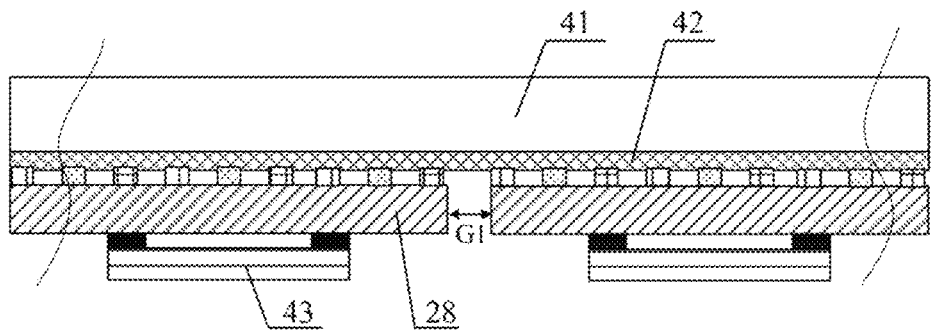
FIG. 9 is a schematic sectional structural diagram of a display panel according to an exemplary embodiment.

FIG. 9 is a schematic sectional structural diagram of a display panel according to an exemplary embodiment. In an exemplary embodiment, as shown in FIG. 9, the display panel includes a carrier base substrate 41. A plurality of sub-panels 20 are tiled in sequence on the carrier base substrate 41. The display panel further includes a fixing glue 42 provided between the sub-panel 20 and the carrier base substrate 41, and a control circuit board 43 electrically connected to the sub-panel 20. The sub-panel 20 includes a driving substrate 28 and a plurality of LED chips arranged on a side of the driving substrate 28. The plurality of LED chips are located in a corresponding pixel.

In an exemplary embodiment, as shown in FIG. 9, the material of the carrier base substrate 41 may be transparent glass with a thickness of about 1.0 mm. The size of the carrier base substrate 41 may be determined as required. If it is needed to assemble n*m sub-panels in an applicable situation, the carrier base substrate 41 may be directly customized to meet the size requirements (if the customized size of the carrier base substrate 41 is too large, tiling of a plurality of carrier base substrates 41 may be available), and then the n*m sub-panels are assembled onto the carrier base substrate 41. The fixing glue 42 is used to fix the sub-panel 20 and the carrier base substrate 41. The fixing glue 42 may be a transparent optical glue (OCA glue or OCR glue). The micro LED or mini LED may include a red, a green and a blue LED. The driving substrate 28 is used to drive the LED to operate. Metal traces made of copper may be provided on the driving substrate 28.

The sub-panel in FIG. 9 may be a sub-panel as shown in FIG. 7. Both the first edge and the second edge of the sub-panel are ground. As shown in FIG. 9, G1=pt+pa, where pt is grinding accuracy and pa is assembly accuracy. In the case that pt=0.02 mm and pa=0.01 mm, the designed value of G1 is 0.03 mm.

In order to ensure that the spacing deviation between the effective display bodies on both sides of the seam is less than 10 μm, the width of the driving substrate 28 is required to be 30 microns smaller than the designed size.

Figure 10:
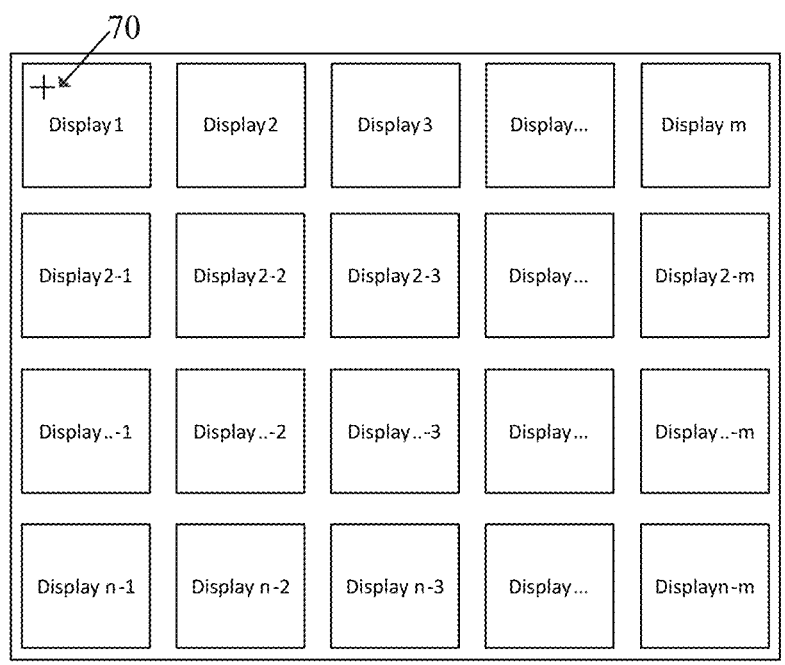
FIG. 10 is a schematic top view of the sub-panels assembled on a carrier base substrate.

FIG. 10 is a schematic top view of the sub-panels assembled on a carrier base substrate. As shown in FIG. 10, during assembly, a mark 70 may be formed by exposing and developing at a certain corner on the carrier base substrate, and a mark may be formed by exposing and developing at a corresponding position of the sub-panel. Through assembly by optical focusing, the assembly accuracy is within 10 μm.

Figure 11:
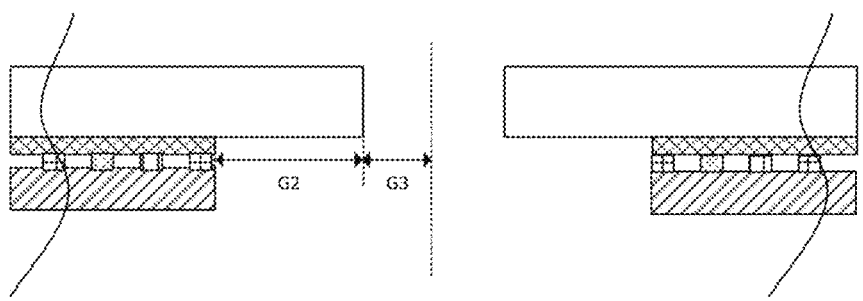
FIG. 11 is a schematic structural diagram of tiling of a plurality of display panels.

If the size of the display panel is very large, tiling of a plurality of carrier base substrates 41 may be available. FIG. 11 is a schematic structural diagram of tiling of a plurality of display panels. As shown in FIG. 11, the gap between the carrier base substrates is designed as follows:

G2=dimensional tolerance A of the sub-panel+dimensional tolerance B of the carrier base substrate+assembly tolerance C of the sub-panel and the carrier base substrate;

G3=dimensional tolerance B of the carrier base substrate.

In order to ensure that the spacing between the effective display bodies on both sides of the seam is equal to, or has a deviation of less than or equal to p*δ from, the spacing between the adjacent effective display bodies at the position other than the seam. The sizes of the sub-panel and the carrier base substrate are required to be smaller than preset sizes. The specific values are as follows:

reduction value of the sub-panel size being equal to A+B+C; reduction value of the carrier base substrate size being B.

A seamless tiling method may include the following steps, as shown in FIG. 10 and FIG. 9.

S11: at least one cross mark 70 is formed on the carrier base substrate by exposing and developing. For example, four marks 70 may be formed. A cross mark is formed at a corresponding position of the sub-panel.

S12: the carrier base substrate is cut or ground to a corresponding designed value, and a fixing glue is attached onto the carrier base substrate, where the thickness of the fixing glue is about 0.2 mm S13: the first cross mark 70 serves as a datum point, and at the same time the cross mark at the corresponding position of the sub-panel is located, and the first sub-panel is assembled to a side of the carrier base substrate provided with the fixing glue by optical focusing.

S14: the assembly equipment moves a preset step length to assemble a second sub-panel, and other sub-panels are assembled in the same manner S15: the fixing glue is cured and defoamed.

Subsequently, the carrier base substrate is fixed with a box body.

In an exemplary embodiment, a seamless tiling method may include the following steps.

S21: a cross mark 70 is respectively formed on the carrier base substrate at a preset position for the first sub-panel by exposing and developing processes, and a mark is formed at the corresponding position of the sub-panel.

S22: the carrier base substrate is cut or ground to a corresponding designed value, and a fixing glue is attached onto the carrier base substrate, where the thickness of the fixing glue is about 0.2 mm S23: the first cross mark 70 serves as a datum point, and at the same time the cross mark at the corresponding position of the sub-panel is located, and the first sub-panel is assembled to a side of the carrier base substrate provided with the fixing glue by optical focusing.

S24: other sub-panels are assembled onto a side of the carrier base substrate provided with the fixing glue according to the method of S23.

S25: the fixing glue is cured and defoamed.

The principle of a method for eliminating defects of the display panel is to adjust the display time of each LED in the pixel one by one (lower or less than a standard value), so as to adjust the brightness of the LED for uniformity compensation.

The method for eliminating the defects of the display panel may include the following steps.

S31: each LED of the display panel is assigned a unique number in a system.

S32: turn on each LED of the display panel.

S33: a CCD camera may be used to shoot a cloud picture of the brightness of the whole display area. If the ratio of the brightness at the seam to the brightness at the center of the display panel is less than 1-6, a duty ratio of the display time of the LED at the seam is increased, and the brightness of the LED at the seam is increased to more than 1-6 of the brightness at the center. If the ratio of the brightness at the seam to the brightness at the center of the display panel is greater than 1-6, the duty ratio of the display time of LED at the seam is reduced, and the brightness of LED at the seam is reduced to below 1+6 of the brightness at the center, so as to control the brightness of the whole display area in a range from 1-6 to 1-6 of the brightness at the center, where 3%≤δ≤5%.

Figure 12:
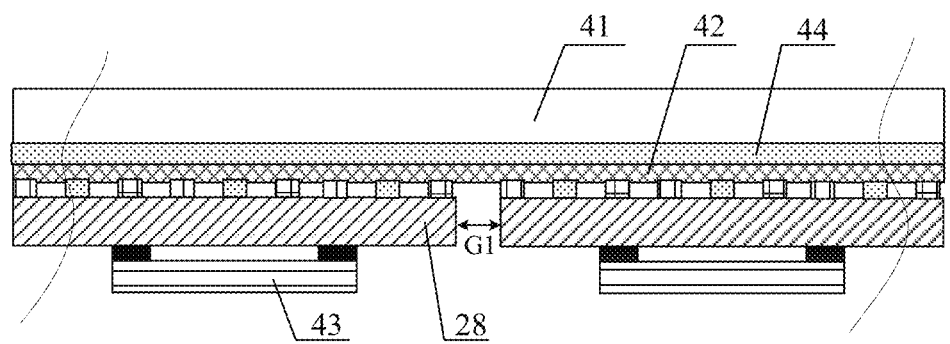
FIG. 12 is a schematic structural diagram of a display panel according to an exemplary embodiment.

FIG. 12 is a schematic structural diagram of a display panel according to an exemplary embodiment. In an exemplary embodiment, as shown in FIG. 12, the display panel may further include a touch layer 44. The touch layer 44 may be located between the carrier base substrate 41 and the fixing glue 42. When a user presses on a certain position of the carrier base substrate, the touch layer transmits positional information of the pressing point to a touch circuit to realize response.

In another aspect, the present disclosure also provides a display apparatus, including a display panel according to the aforementioned embodiments. The display apparatus may be any product or component with a display function, such as a mobile phone, a tablet computer, a television, a display, a notebook computer, a digital photo frame, a navigator, etc.

In the description of the present disclosure, it should be understood that, an orientational or positional relationship indicated by terms "inside", "outside" or the like is based on the orientational or positional relationship shown in the drawings, and it is only for ease of description of the present disclosure and simplification of the description, rather than indicating or implying that the referred apparatus or element must have a specific orientation, or be constructed and operated in a particular orientation, and therefore cannot be understood as a limitation on the present disclosure.

In the description of the present disclosure, it should be noted that unless otherwise explicitly specified and defined, a term "connect" should be understood broadly, for example, it may be an electrical connection; it may be a direct connection, or it may be an indirect connection through an intermediate medium, or it may be an internal communication of two elements. For those of ordinary skills in the art, the specific meanings of the above terms in the present disclosure may be understood according to specific situations.

Although implementations disclosed in the present disclosure are as the above, the described contents are only implementations used for facilitating the understanding of the present disclosure, and are not used to limit the present disclosure. Any person skilled in the art to which the present disclosure pertains may make any modifications and variations in the forms and details of implementation without departing from the spirit and the scope of the present disclosure, but the patent protection scope shall still be subject to the scope defined in the appended claims.

From the foregoing, it will be appreciated that specific embodiments of the invention have been described herein for purposes of illustration, but that various modifications may be made without deviating from the scope of the invention. Accordingly, the invention is not limited except as by the appended claims.

The invention claimed is:

1. A display panel, comprising a plurality of sub-panels arranged in sequence along a first direction,
    wherein the sub-panels have a first edge and a second edge in the first direction;
    wherein the sub-panels comprise a plurality of columns of pixels;
    wherein the plurality of columns of pixels comprise a column of first pixels closest to the first edge, a column of second pixels closest to the second edge, and a plurality of columns of third pixels between the column of first pixels and the column of second pixels;
    wherein an effective display body is provided in each of the first pixels, the second pixels and the third pixels, and
    a sum of a distance between effective display bodies in the first pixels and the first edge and a distance between effective display bodies in the second pixels and the second edge is smaller than a spacing between effective display bodies in two adjacent columns of third pixels;
    the first edge is located at a position which has a first distance p8 from effective display bodies in the first pixels, the p8 is equal to a width of a MUX region arranged at a side of the sub-panels; and the second edge is located at a position which has a second distance p9 from effective display bodies in the second pixels;
    the plurality of sub-panels arranged in sequence along the first direction comprises a first sub-panel located at an edge, the first sub-panel comprises a first outline edge close to a side of a second pixel that is located on the first sub-panel, the first outline edge is coincided with a second outline edge of the plurality of sub-panels arranged in sequence along the first direction when the plurality of sub-panels arranged in sequence along the first direction serve as a whole;
    and the p9 is equal to a distance between the first outline edge and effective display bodies in the second pixels on the first sub-panel.

2. The display panel of claim 1, wherein the third pixels have a first boundary towards the first edge and a second boundary towards the second edge; wherein a distance between effective display bodies in the third pixels and the first boundary and a distance between effective display bodies in the third pixels and the second boundary are p1 and p4 respectively; wherein a distance between effective display bodies in the first pixels and a boundary of the first pixels towards the second edge is p24, a distance between effective display bodies in the second pixels and a boundary of the second pixels towards the first edge is p21; and wherein p21=p1, and p24=p4.

3. The display panel of claim 2, wherein p9<p4, and p8=p1.

4. The display panel of claim 2, wherein p9=p4, and p8<p1.

5. The display panel of claim 2, wherein p9<p4, and p8<p1.

6. The display panel of claim 1, wherein the third pixels have a first boundary towards the first edge and a second boundary towards the second edge; wherein a distance between effective display bodies in the third pixels and the first boundary and a distance between effective display bodies in the third pixels and the second boundary are p1 and p4 respectively; wherein a distance between effective display bodies in the first pixels and a boundary of the first pixels towards the second edge is p24, a distance between effective display bodies in the second pixels and a boundary of the second pixels towards the first edge is p21; wherein p9<p4, p21<p1, p8=p1, and p24=p4.

7. The display panel of claim 6, wherein a width of the third pixels in the first direction is p, and wherein p1−p21≤p*δ, and 3%≤δ≤5%.

8. The display panel of claim 6, wherein the sub-panels further comprise k columns of fourth pixels between the column of second pixels and the plurality of columns of third pixels; wherein effective display bodies are arranged in the fourth pixels; wherein a distance between effective display bodies in the fourth pixels and a boundary of the fourth pixels towards the first edge is p22, a distance between effective display bodies in the fourth pixels and a boundary of the fourth pixels towards the second edge is p23; and wherein p21<p22, and p22<p1.

9. The display panel of claim 8, wherein a width of the third pixels in the first direction is p, and wherein p1−p22≤p*δ, (p1+p4)−(p21+p23)≤p*δ, and 3%≤δ≤5%.

10. The display panel of claim 1, wherein the third pixels have a first boundary towards the first edge and a second boundary towards the second edge, a distance between effective display bodies in the third pixels and the first boundary and a distance between effective display bodies in the third pixels and the second boundary are p1 and p4, respectively; wherein a spacing width between two adjacent sub-panels in the first direction is w1; and a difference between a sum of p1 and p4 and a sum of p8 and p9 is substantially equal to w1.

11. The display panel of claim 1, further comprising a plurality of sub-panels arranged in sequence along a second direction, wherein the sub-panels have a third edge and a fourth edge in the second direction; wherein the sub-panels comprise a plurality of rows of pixels; wherein the plurality of rows of pixels comprise a row of fifth pixels closest to the third edge, a row of sixth pixels closest to the fourth edge, and a plurality of rows of the third pixels between the row of fifth pixels and the row of sixth pixels; wherein an effective display body is provided in each of the fifth pixels and the sixth pixels, and a sum of a distance between effective display bodies in the fifth pixels and the third edge and a distance between effective display bodies in the sixth pixels and the fourth edge is smaller than a spacing between effective display bodies in two adjacent rows of third pixels.

12. The display panel of claim 11, wherein a distance between effective display bodies in the fifth pixels and the third edge is p31, a distance between effective display bodies in the sixth pixels and the fourth edge is p34; wherein the third pixels have a fourth boundary towards the third edge and a third boundary towards the fourth edge; wherein a distance between effective display bodies in the third pixels and the fourth boundary and a distance between effective display bodies in the third pixels and the third boundary are p3 and p2, respectively; wherein a spacing width between two adjacent sub-panels in the second direction is w2; and wherein a difference between a sum of p3 and p2 and a sum of p31 and p34 is substantially equal to w2.

13. The display panel of claim 11, wherein the third pixels have a fourth boundary towards the third edge and a third boundary towards the fourth edge; wherein a distance between effective display bodies in the third pixels and the third boundary and a distance between effective display bodies in the third pixels and the fourth boundary are p3 and p2 respectively; wherein a distance between effective display bodies in the fifth pixels and a boundary of the fifth pixels towards the fourth edge is p32, a distance between effective display bodies in the sixth pixels and a boundary of the sixth pixels towards the third edge is p33; and wherein p32=p2, and p33=p3.

14. The display panel of claim 1, wherein the plurality of sub-panels are tiled in sequence along the first direction, and there is a seam between two adjacent sub-panels.

15. The display panel of claim 1, wherein the plurality of sub-panels are tiled in sequence along the first direction, there is a seam between two adjacent sub-panels, and the seam has a width of w1;
the third pixels have a first boundary towards the first edge and a second boundary towards the second edge, a distance between effective display bodies in the third pixels and the first boundary and a distance between effective display bodies in the third pixels and the second boundary are p1 and p4, respectively; a difference between a sum of p1 and p4 and a sum of p8 and p9 is substantially equal to w1.

16. The display panel of claim 11, wherein the plurality of sub-panels are tiled in sequence along the second direction, and there is a seam between two adjacent sub-panels.

17. The display panel of claim 11, wherein the plurality of sub-panels are tiled in sequence along the second direction, there is a seam between two adjacent sub-panels, and the seam has a width of w2;
a distance between effective display bodies in the fifth pixels and the third edge is p31, a distance between effective display bodies in the sixth pixels and the fourth edge is p34; wherein the third pixels have a fourth boundary towards the third edge and a third boundary towards the fourth edge; wherein a distance between effective display bodies in the third pixels and the fourth boundary and a distance between effective display bodies in the third pixels and the third boundary are p3 and p2, respectively; and wherein a difference between a sum of p3 and p2 and a sum of p31 and p34 is substantially equal to w2.

18. The display panel of claim 1, wherein the effective display body comprises a plurality of LED chips and a bank structure around each of the LED chips, and wherein the bank structure is configured to make light emitted from the LED chip converge.

19. The display panel of claim 1, further comprising a carrier base substrate, wherein a plurality of the sub-panels are arranged in sequence on the carrier base substrate, and there is a spacing between two adjacent sub-panels, and a carrier base substrate opposite to the spacing is continuously extended.

20. A display apparatus, comprising a display panel comprising a plurality of sub-panels arranged in sequence along a first direction,
- wherein the sub-panels have a first edge and a second edge in the first direction;
- wherein the sub-panels comprise a plurality of columns of pixels;
- wherein the plurality of columns of pixels comprise a column of first pixels closest to the first edge, a column of second pixels closest to the second edge, and
- a plurality of columns of third pixels between the column of first pixels and the column of second pixels;
- wherein an effective display body is provided in each of the first pixels, the second pixels and the third pixels, and
- a sum of a distance between effective display bodies in the first pixels and the first edge and a distance between effective display bodies in the second pixels and the second edge is smaller than a spacing between effective display bodies in two adjacent columns of third pixels;
- the first edge is located at a position which has a first distance p8 from effective display bodies in the first pixels, the p8 is equal to a width of a MUX region arranged at a side of the sub-panels; and the second edge is located at a position which has a second distance p9 from effective display bodies in the second pixels;
- the plurality of sub-panels arranged in sequence along the first direction comprises a first sub-panel located at an edge, the first sub-panel comprises a first outline edge close to a side of a second pixel that is located on the first sub-panel, the first outline edge is coincided with a second outline edge of the plurality of sub-panels arranged in sequence along the first direction when the plurality of sub-panels arranged in sequence along the first direction serve as a whole; and the p9 is equal to a distance between the first outline edge and effective display bodies in the second pixels on the first sub-panel.

* * * * *